United States Patent [19]

Schwartz

[11] 4,228,521
[45] Oct. 14, 1980

[54] PHASE CONTROLLED DECODER FOR BUBBLE MEMORIES

[75] Inventor: Sidney J. Schwartz, Vista, Calif.

[73] Assignee: Burroughs Corporation, Detroit, Mich.

[21] Appl. No.: 18,513

[22] Filed: Mar. 8, 1979

[51] Int. Cl.$^2$ ............................................. G11C 19/08
[52] U.S. Cl. ........................................ 365/4; 365/16
[58] Field of Search ........................... 365/4, 5, 13, 16

[56] References Cited

U.S. PATENT DOCUMENTS 4,094,005  6/1979  Chen ..................................... 365/16

Primary Examiner—Vincent P. Canney
Attorney, Agent, or Firm—Joseph R. Dwyer; Kevin R. Peterson

[57] ABSTRACT

An on-chip magnetic bubble decoder comprising a plurality of sequentially operated gates oriented to be responsive to different phases of the rotating in-plane magnetic field and connected to a conductor which is pulsed at the selected phase of the cycle to transfer bubbles from one track onto different tracks to be propagated therefrom. In its simplest form, one gate oriented to be operated during the phase 2 time of the cycle and a second gate oriented to be responsive to the phase 1 time of the cycle, all operable by a single conductor, thus form a four output decoder with two gates and a single conductor. A second conductor controls a third gate which modulates the bubble stream to control the data being decoded. Further embodiments of the invention include 8 output decoder (2 data bits decoded into 1 of 4 paths) with only two conductors for activating the gates and a 1 of 16 output decoder with 2 conductors for decoding and a third for data control. In another embodiment the 16 output decoder is arranged with the data control gates located at the decoder output to reduce write cycle latency.

10 Claims, 9 Drawing Figures

◇ ANNIHILATOR

PHASE CONTROLLED DECODER FOR BUBBLE MEMORIES

CORRESPONDING REFERENCE TO RELATED APPLICATIONS

U.S. application entitled "Phase Controlled Gating" by Sidney J. Schwartz, U.S. Ser. No. 18,511, filed even date herewith and U.S. application entitled "Phase Controlled Replicate/Swap Gate for Bubble Memories" by Sidney J. Schwartz, U.S. Ser. No. 18,512 filed even date herewith.

BACKGROUND OF THE INVENTION

This invention relates to magnetic bubble (domain) memories and in particularly to a new and improved on-chip decoder for the transfer of information to and from memory.

Bubble memories having propagate elements on which bubbles propagate element-to-element in response to a rotating in-plane magnetic field are, of course, old in the art. In bubble memory arrays, these propagate elements are conventionally arranged in loops so that bubbles transferred into the loop will circulate indefinitely in said loops until transferred out. Thus, bubbles circulating in these storage loops represent information stored in memory and, when information stored in memory is transferred out of the storage loops, the presence or absence of a bubble on a propagate element is detected in a bubble detector which sends a representative signal to a utilization device.

Read and write on-chip decoding for transferring information into memory is old in the art as disclosed in the U.S. Pat. No. 3,689,902 and 3,701,125 both of which issued to Chang et al. The patented write decoder has its input connected either to a plurality of bubble domain generators, or to a single generator connected selectively to various propagation channels in the write decoder. As stated in the patents, the basic element of the decoder is an OR switch, sometimes called a port or gate, which consists of a current loop superimposed on a propagate element. The proper arrangement of these OR switches permits the selection of $2^N$ storage loops by $2^N$ control conductor (N pairs). The decoders have $2^N$ double propagation paths or tracks each of which has two paths. One path connects a bubble domain generator to the storage loop while the other path terminates in an annihilator. Thus, depending upon the presence or absence of control signals, bubble domain inputs from the generators are propagated to selected storage loops or are destroyed.

FIG. 1 shows such a prior art on-chip decoder arranged to write information into memory. In FIG. 1, four tracks 10-16 of propagate elements connect four output tracks to storage loops 1-4 with four sources of bubble generators G, which generate bubbles which are then propagated on tracks past a plurality (eight shown) of transfer gates. As shown, four conductor A, $\bar{A}$, B and $\bar{B}$, each have two gates for decoding the information to be entered into memory. Bubbles, being propagated on the tracks, cross over control conductors and gates, and the control conductors are selectively supplied with a current pulse which switches an undesired bubble to a second track 1a-4a, which directs the bubble to an annihilator. On the other hand, a bubble in the track in a gate whose conductor is not pulsed allows the bubble to continue on to one of the decoder output tracks 1-4. Of course, control circuitry is required for accounting for the bubbles passing through the decoder so that the proper conductors are pulsed, or not pulsed, for the particular input to the storage memory selected.

The problem with the prior art decoder is the number of conductors required to operate the gates and the associated number of off chip electronic circuits.

It is therefore an object of this invention to provide a decoder in a bubble memory in which the number of conductors and external circuits for operating the decode gates is reduced.

As will be apparent from the following description of the drawings and the preferred embodiments of the invention, reduction in the number of conductors results in a cost reduction and simplicity in operation. The cost reduction results from the fact that less space is used on the chips for metallization of the conductor runs and less bonding pads are required. A further cost reduction results because the external circuitry, which drives fewer conductor lines, can serve multiple functions thus eliminating some electronic components from the memory system.

SUMMARY OF THE INVENTION

The decoder of this invention comprises a plurality of sequentially operated gates oriented to be responsive to different phases of the rotating in-plane magnetic field and connected to a conductor which is pulsed at the selected phase of the cycle to transfer bubbles from one track onto different tracks to be propagated therefrom. In its simplest form, one gate oriented to be operated during the phase 2 time of the cycle and a second gate oriented to be responsive to the phase 1 time of the cycle, all operable by a single conductor, thus form a four output decoder with two gates and a single conductor. A second conductor controls a third gate which modulates the bubble stream to control the data being decoded. Further embodiments of the invention include 8 output decoder (2 data bits decoded into 1 of 4 paths) with only two conductors for activating the gates and a 1 of 16 output decoder with 2 conductors for decoding and a third for data control. In another embodiment the 16 output decoder is arranged with the data control gates located at the decoder output to reduce write cycle latency.

BRIEF DESCRIPTION OF THE PREFERRED EMBODIMENT

Figure 1:
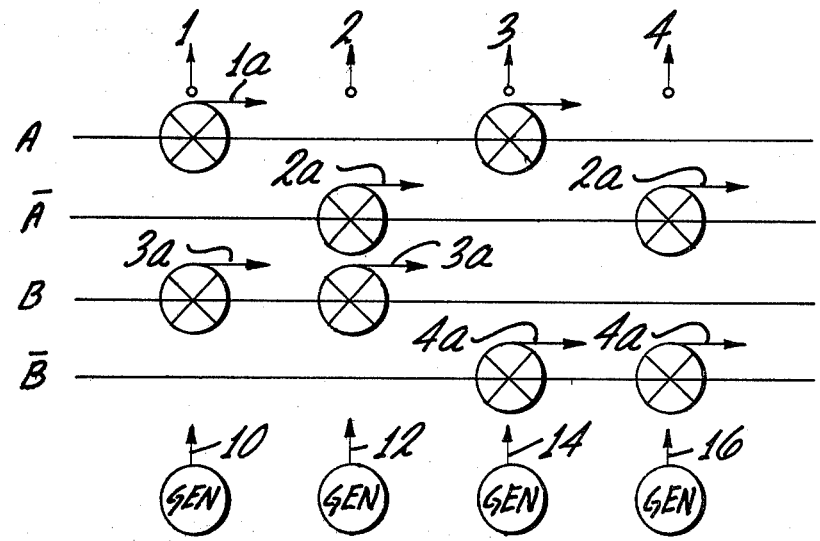
FIG. 1 illustrates a prior art decoder having four conductor lines representing a four decoded output.

Since the prior art decoder of FIG. 1 was discussed, supra, it is suffice to say here that the four output decoder requires four conductors.

Figure 2:
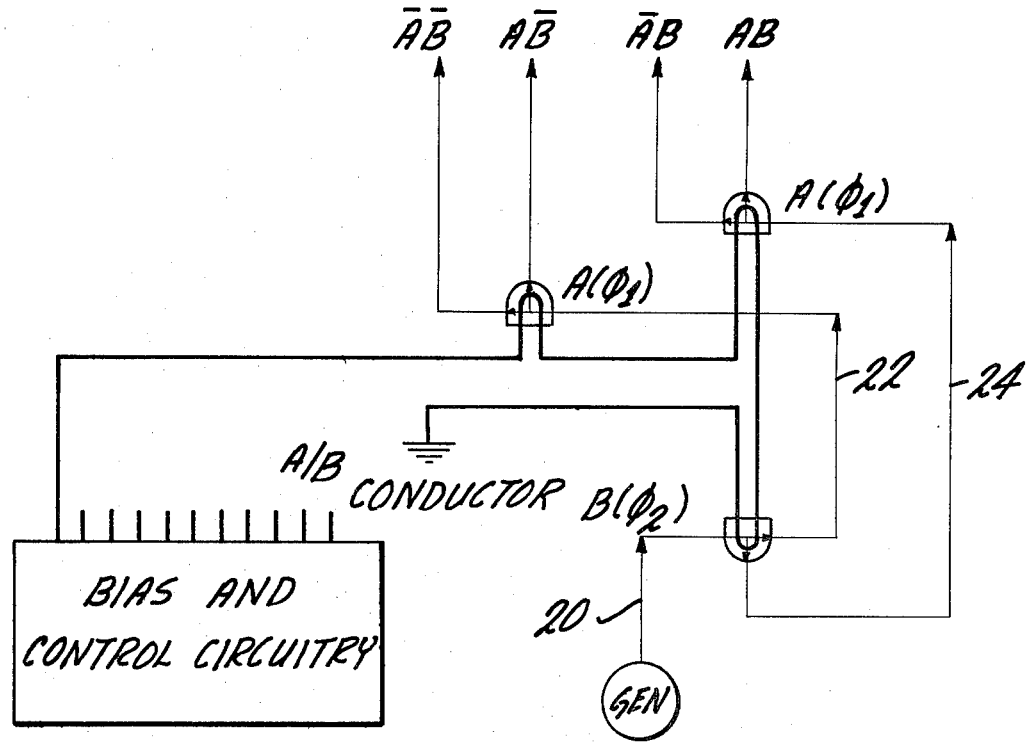
FIG. 2 is an illustration of a decoder utilizing phase decoding with a number of outputs corresponding to FIG. 1 but with a reduction from 4 to 1 in the number of conductors for controlling the decoder gating.

FIG. 2, on the other hand, shows a sequential logic four output decoder comprising the present invention utilizing only one conductor A/B. Two A ($\phi_1$) decode gates and one B ($\phi_2$) decode gate are operable by this one conductor for outputs A B, A $\overline{B}$, $\overline{A}$ B, and $\overline{A}$ $\overline{B}$. The decode gates, by reason of their operation in a selected phase of the in-plane magnetic field, are identified as A ($\phi_1$) and B ($\phi_2$), but for simplicity will be sometimes referred to as gates A and B. Gate B is connected by a line 20 to a generator and the outputs of the B gate, lines 22 and 24 connect the B gate to the two A gates whose outputs represent the output of the decoder. Lines 20–24 are, of course, tracks of propagate elements on which bubbles are propagated in response to the in-plane rotating field.

Thus, the decoder of the present invention utilizes only one conductor line, as compared to the prior art decoder, for a similar output—a 4 to 1 reduction in conductor lines.

It is to be understood, of course, that the decoder of FIG. 2 is on a magnetic chip suitable for bubble domain support and propagation, that the bubble domain generator is conventional, that there is a memory storage location together with bubble domain detectors and annihilators, and that propagation of bubble domains from propagate element-to-element in the chip is caused by the rotation of the propagation field referred to above as an in-plane rotating magnetic field. Thus, in FIG. 2, the chip is shown with a block diagram representing the bias source and control circuitry to provide the synchronization and controls for the conductor and other bubble circuit elements on the chip.

Figure 3:
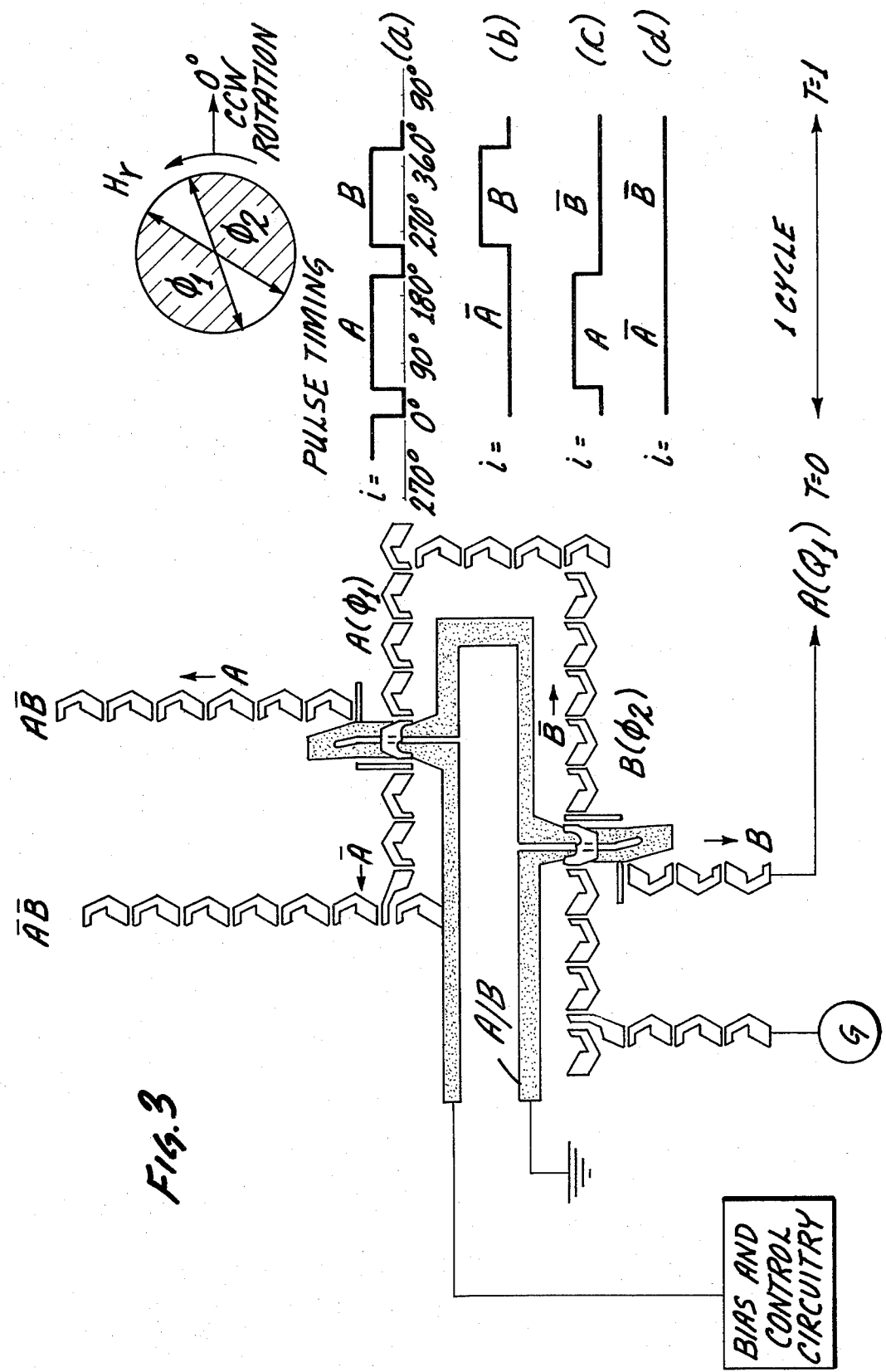
FIG. 3, including a-d, illustrates phase controlled gating with accompanying timing diagrams, utilized as a basic element in the phase controlled decoder of FIG. 2.

Turning now to FIG. 3, there is shown a portion of the gating circuitry of FIG. 2 to illustrate phase controlled gating utilized in the decoder of the present invention. This Figure is a version of phase control gating referred to in the Schwartz U.S. application entitled "Phase Controlled Gating", supra, and incorporated herein to show a specific embodiment of two of the gates and its arrangement with propagate elements, generator, bias and control circuitry. A more detailed description of phase controlled gating can be found in the Schwartz application.

In the illustration shown in FIG. 3, bubbles generated at the generator G are propagated in response to the counter-clockwise rotation of the rotating in-plane magnetic field represented by the circle of $H_r$. Upon reaching the gate B, and at phase 2, a pulse on the conductor A/B will transfer the bubble for propagation along the path which corresponds to line 24 of FIG. 2, the true output B to the gate A ($\phi_1$) not shown in this FIG. 3. Line (a) of the timing diagram indicates the transfer of a bubble to track B at gate B and the transfer of a bubble at gate A (not shown) to track A for an A B output. On the other hand, if the conductor was not pulsed during phase 2 time and a bubble was at gate B, the bubble would propagate to track $\overline{B}$ toward the shown gate A. In another situation, if a bubble on reaching the shown gate A and the conductor was not pulsed at phase 1, the bubble would continue to the track identified as $\overline{A}$ $\overline{B}$. This is shown in the timing diagram line (b).

Timing diagram line (c) shows, on the other hand, a pulse in phase 1 for the transfer of bubble to the true output of the A gate, that is, onto line A $\overline{B}$ with no pulse occurring on the phase 2 time which allows a bubble at gate B to proceed onto the line $\overline{B}$ to the shown gate A.

Finally, the situation where no pulse is applied to the conductor in either phase 1 or phase 2, a bubble at gate B will continue to the $\overline{B}$ line and similarly a bubble at the A gate will continue to the $\overline{A}$ line.

Figure 4:
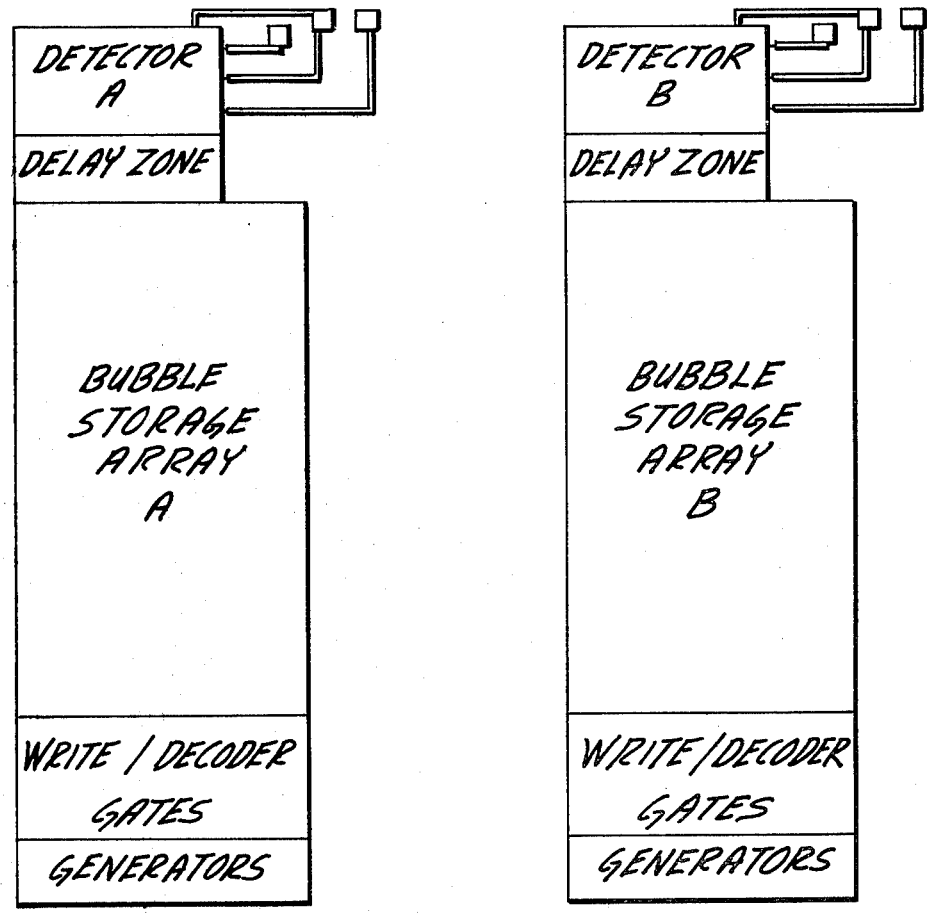
FIG. 4 illustrates a bubble memory chip format with two storage arrays incorporating the phase controlled decoder of the present invention.

FIG. 4 illustrates a layout of a bubble chip with two bubble storage arrays A and B with two separate detector areas, detector A and detector B connected to suitable output pads. While these are shown as two separate decoder areas and two separate generator areas, these areas share the same current conductors. This Figure is simply to illustrate a layout in which the decoder comprising this invention fits into the overall plan of a bubble memory chip.

Figure 5:
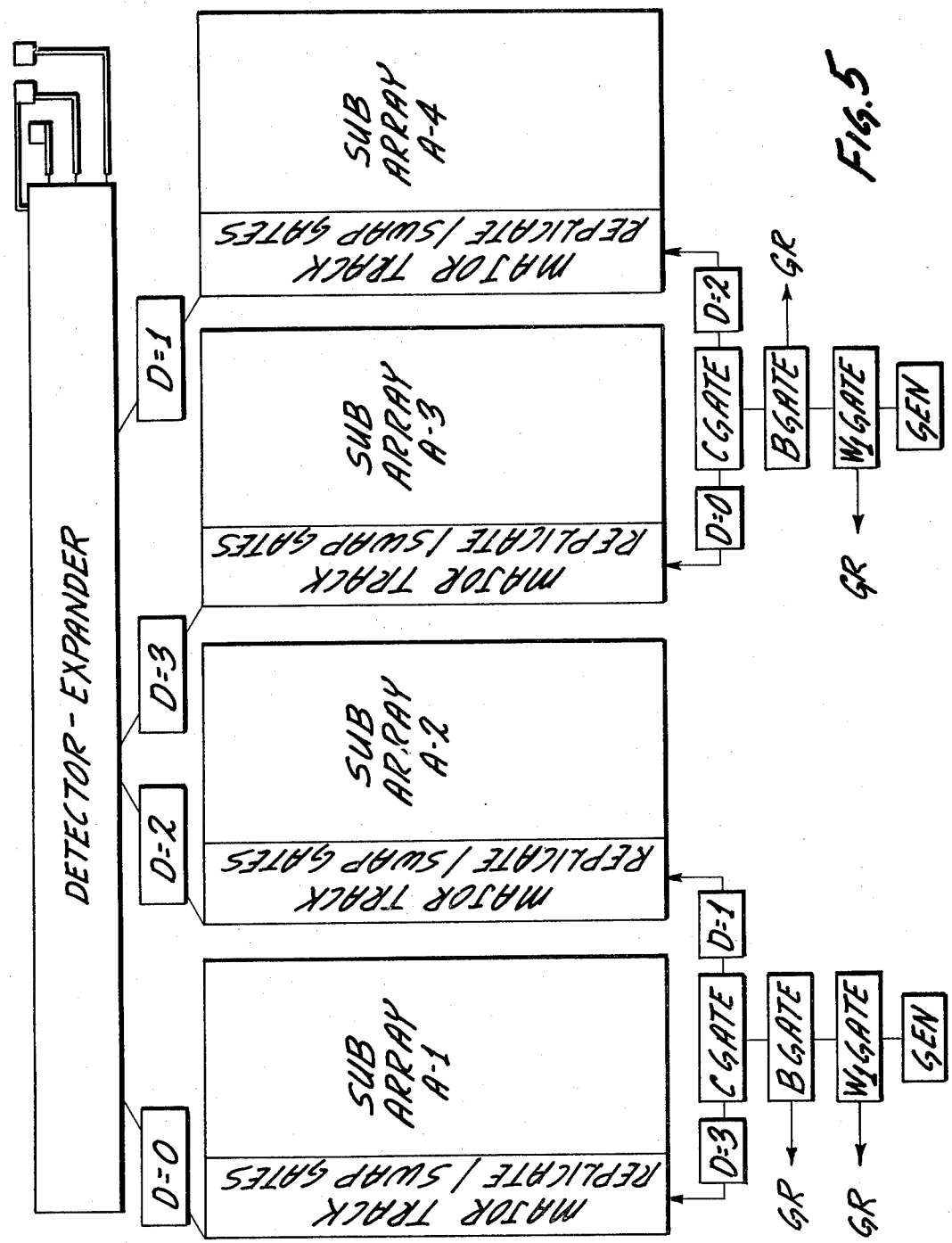
FIG. 5 is one of the arrays of FIG. 4 expanded to show four subarrays.

Turning now to FIG. 5, there is illustrated the bubble storage array A of FIG. 4 divided into subarrays A1, A2, A3 and A4 and showing the delay zones of FIG. 4 as D0–D3 both to and from the subarrays. These delay zones are to synchronize the bubbles between the separate subarrays as they enter the subarrays from the decoder and leave the subarrays for the detector. Also, in this Figure are shown gates, indentified as $W_1$ which control the data in the bubble stream are not shown in FIGS. 2 and 3 while the gates identified as B correspond to the B ($\phi_2$) gates of FIGS. 2 and 3 and the gates labelled C correspond to the A phase 1 gates of these Figures. This Figure illustrates the bubble memory chip and the decoder of this invention. It is to be understood that storage array B of FIG. 4 will have a similar group of subarrays which will be serviced by a single decoder which will now be explained in connection with FIG. 6.

Figure 6:
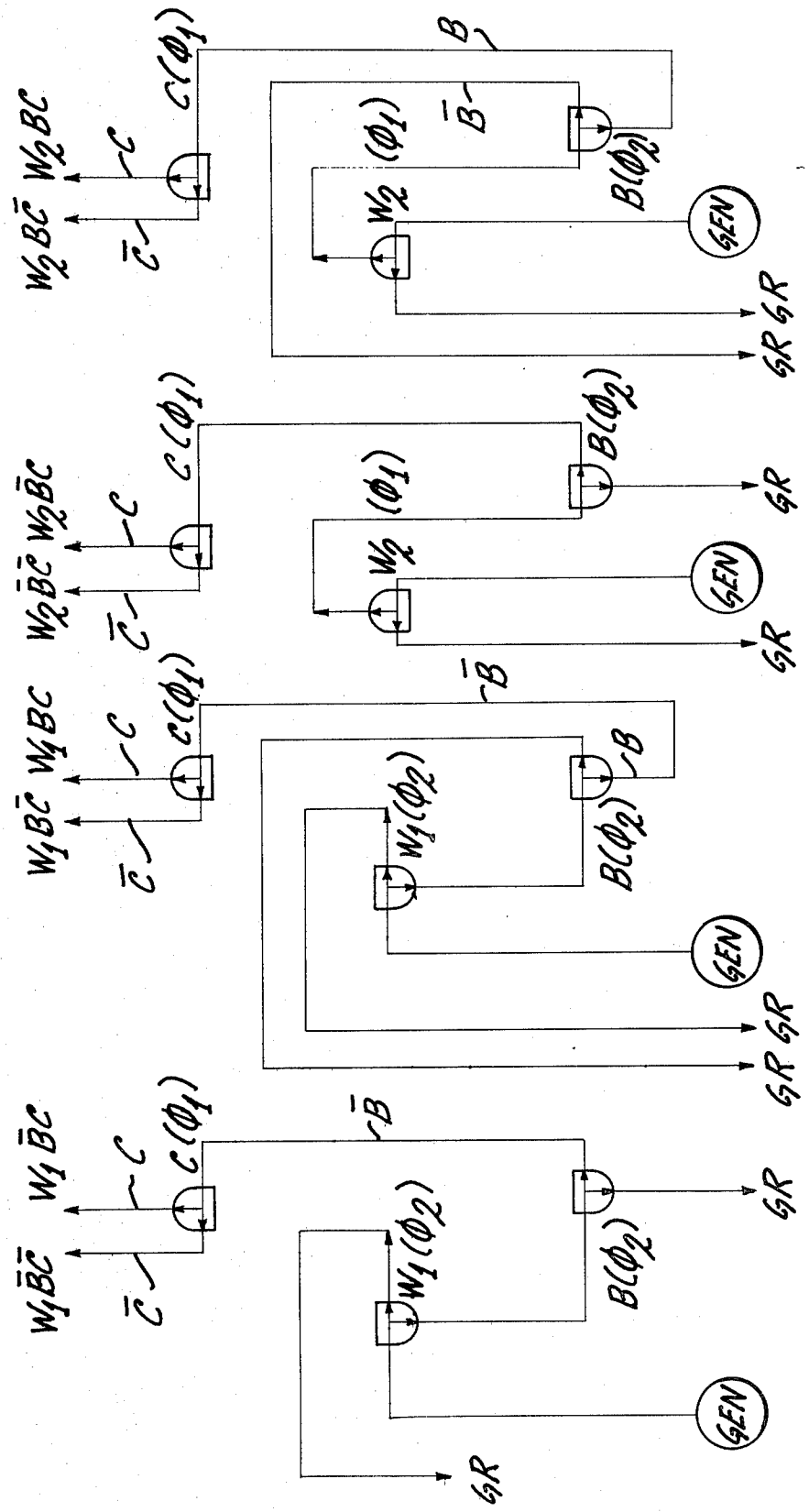
FIG. 6 is a schematic diagram of the phase controlled decoder for the four arrays of FIG. 5.

Turning now to FIG. 6, there is shown a decoder with write selectors comprising four phase control gates as illustrated in FIG. 2, all of which are operable by two conductors W and B/C, to service not only subarrays A1–A4 but also subarrays B1–B4 of array B of FIG. 5.

Again, the data control gates not shown in FIGS. 2 and 3 are identified as the gates W1 and W2 of which there are two, each all connected by conductor W allowing control of data in two streams with a single conductor. In this embodiment the two gates W1 are responsive to a pulse on conductor W during the phase 2 portion of the cycle of the rotating in-plane magnetic filed while the gates W2 are responsive to the phase 1 pulse of the cycle. Again, because of the different response to the different phase of the gates W1 are oriented differently from gates W2. Each of the write gates is provided with a generator G for the supply of bubbles thereto and each gate has one track connected to an annihilator or to a guard rail GR. The write gates are oriented such that if no pulse occurs in either phase 1 or phase 2 on conductor W, the bubbles from the generators will be transferred through the gates and onto the annihilator/guard rails GR. On the other hand, a pulse on the conductor W during the phase 2 portion of the cycle will cause the bubbles at gates W1 to be transferred to the track connected to gates B and the pulse on the conductor during phase 1 portion of the cycle will similarly cause bubbles at gate W2 to be transferred onto the track connected to the B gates.

The phase control gate servicing subarrays A1 and A2 are connected to the conductor B/C and oriented such that if no pulse occurs at phase 2 on conductor B/C a bubble from write gate W1 will pass through the gate onto the B̄ line to gate C. A current pulse on conductor B/C during phase 2, on the other hand, will transfer a bubble at gate B to the track connected to the annihilator/guard rail GR.

The B gate on the phase control gating servicing subarray A3 and A4, on the other hand, operates oppositely to the B gate of the phase control gating servicing subarray A1 and A2. In this gating arrangement, a current pulse on conductor B/C during phase 2 will transfer a bubble at gate B to the B track connecting with gate C. A lack of a pulse on conductor B/C during phase 2 will allow the bubble to continue to the track connected to the annihilator/guard rail GR.

The phase control gating servicing subarrays B1 and B2 is arranged such that its B gate on receiving a current pulse on the conductor B/C at phase 2 will transfer a bubble to the track connected to the annihilator/guard rail GR. Conversely, if no pulse is received at phase 2, a bubble at gate B will be propagate to the B̄ track for propagation to gate C.

The phase control gating servicing subarrays B3 and B4, also responsive to the phase 2 portion of the rotating in-plane field, is connected such that its true output B, i.e., the one connected to gate C, is active upon receiving a pulse on conductor B/C at phase 2 time. The other output from the gate B will allow a bubble to propagate to the track connecting the gate to the annihilator/guard rail GR when no phase 2 pulse is received on conductor B/C.

All of the C gates of the decoder are connected such that a pulse on conductor B/C at phase 1 will transfer a bubble to the C output line whereas a no pulse condition during the phase 1 will allow a bubble to propagate through the gate to the C̄ line.

Figure 7:
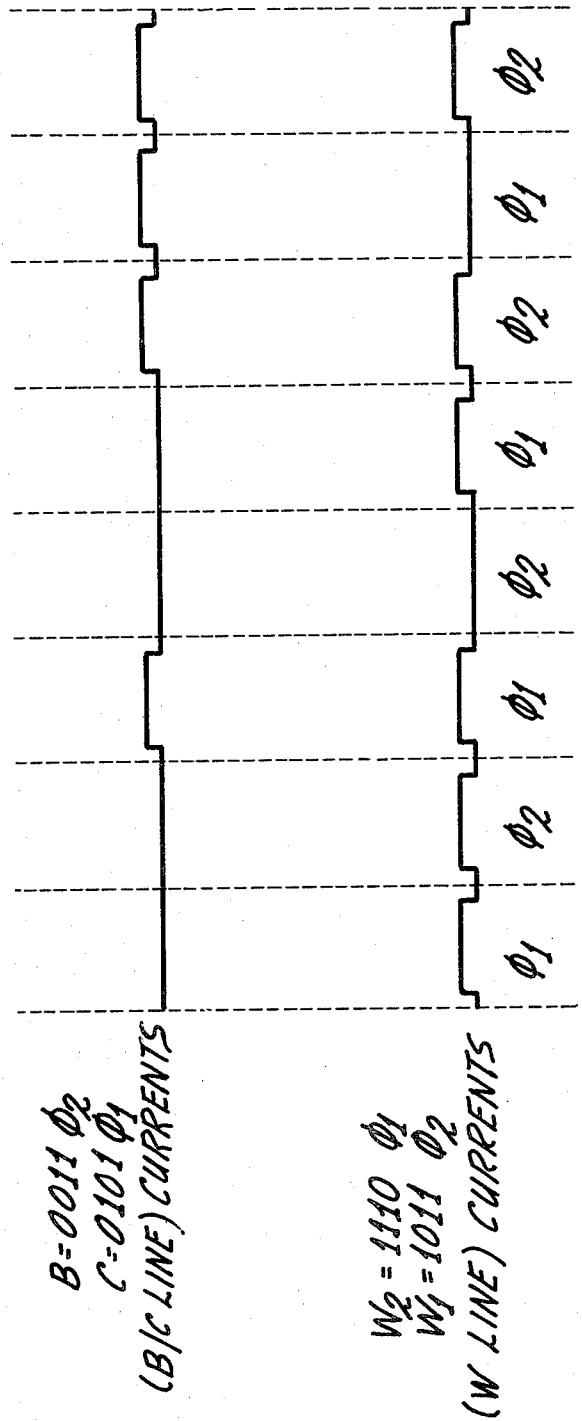
FIG. 7 is a timing diagram of a four bit sequence through the decoder of FIG. 6 and the separate control of data at two write gates.

Having thus described in detail the operation of the decoder in connection with FIG. 6, attention is now directed to the timing diagrams of FIG. 7 showing a four bit sequence through the decoder where gates B and C are, respectively, responsive to a current pulse represented by the binary 0011 at phase 2 while the C gates are responsive to a binary 0101 at phase 1 and the write gates are responsive to the current pulse on line W by a binary pulse representing 1011 on W1 at phase 2 and a binary 1110 at phase 1 on gate W2.

FIGS. 5 and 6 show an eight bit output for the service of eight subarrays with only two conductor lines, 1 of 4 decoders in 2 data paths.

Also, it is apparent that a decoder could be serviced by one generator with four output lines therefrom.

Figure 8:
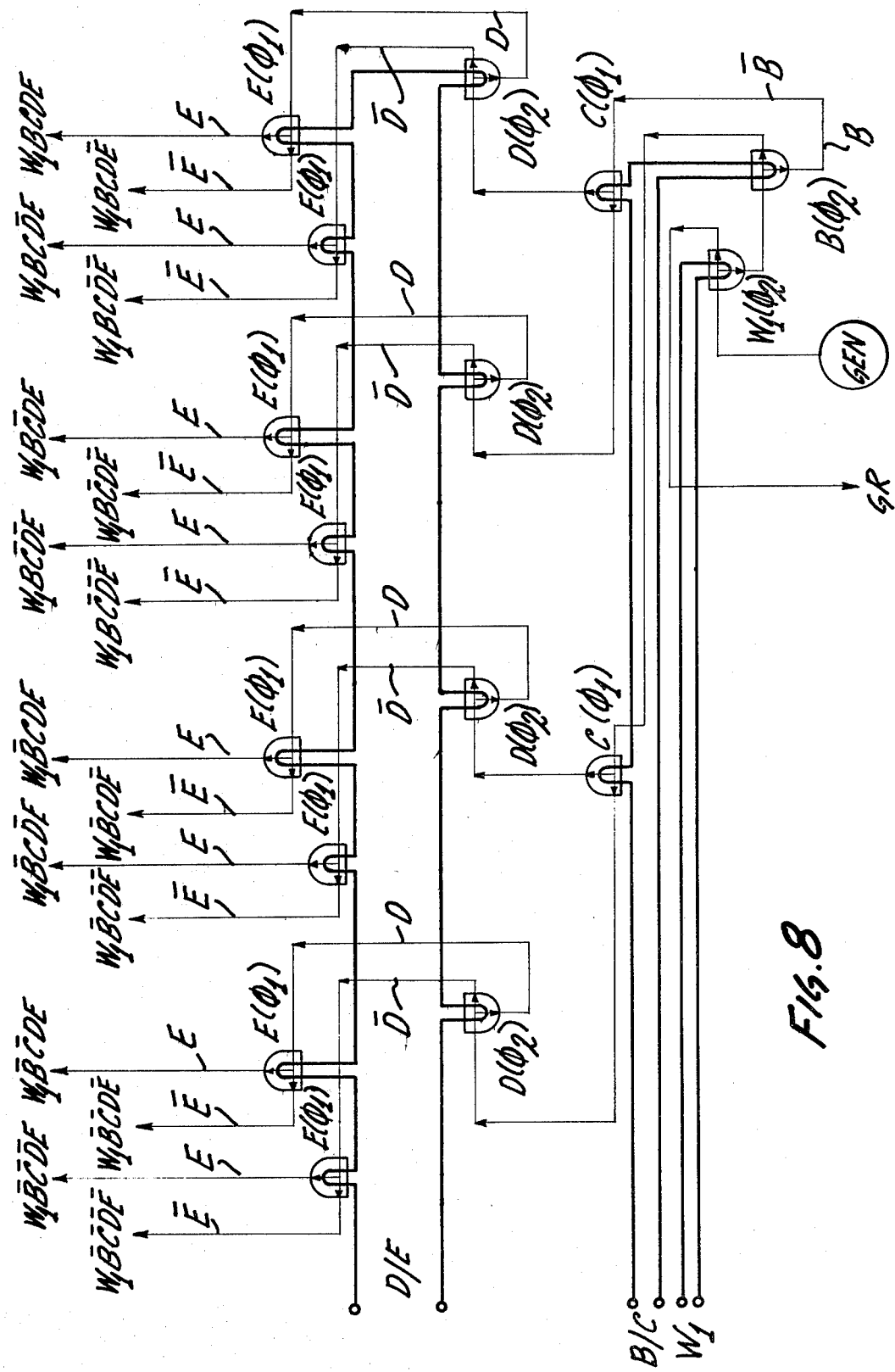
FIG. 8 is an illustration of the expansion of the decoder of FIG. 2 to 16 outputs utilizing a single write gate.

Turning now to FIG. 8, there is shown a single generator 6 servicing 16 outputs from the decoder and a single write gate W1. Gate B, a phase 2 oriented gate, and the two gates C, phase 1 oriented gates, are serviced by a single current conductor B/C with the outputs from gates C being connected to gates D which are oriented to be responsive to the phase 2 portion of the cycle and whose outputs are in turn connected to gates E which are responsive to a current pulse during the phase 1 portion of the cycle. Since the operation of this gate, except for the addition of one more conductor line, is similar to the decoder of FIG. 4, no further description is thought to be necessary. This Figure dramatically shows, however, that two conductors are all that is required to produce a decoder output of 16 tracks to service 16 subarrays and a third conductor is used for data control (writing).

Figure 9:
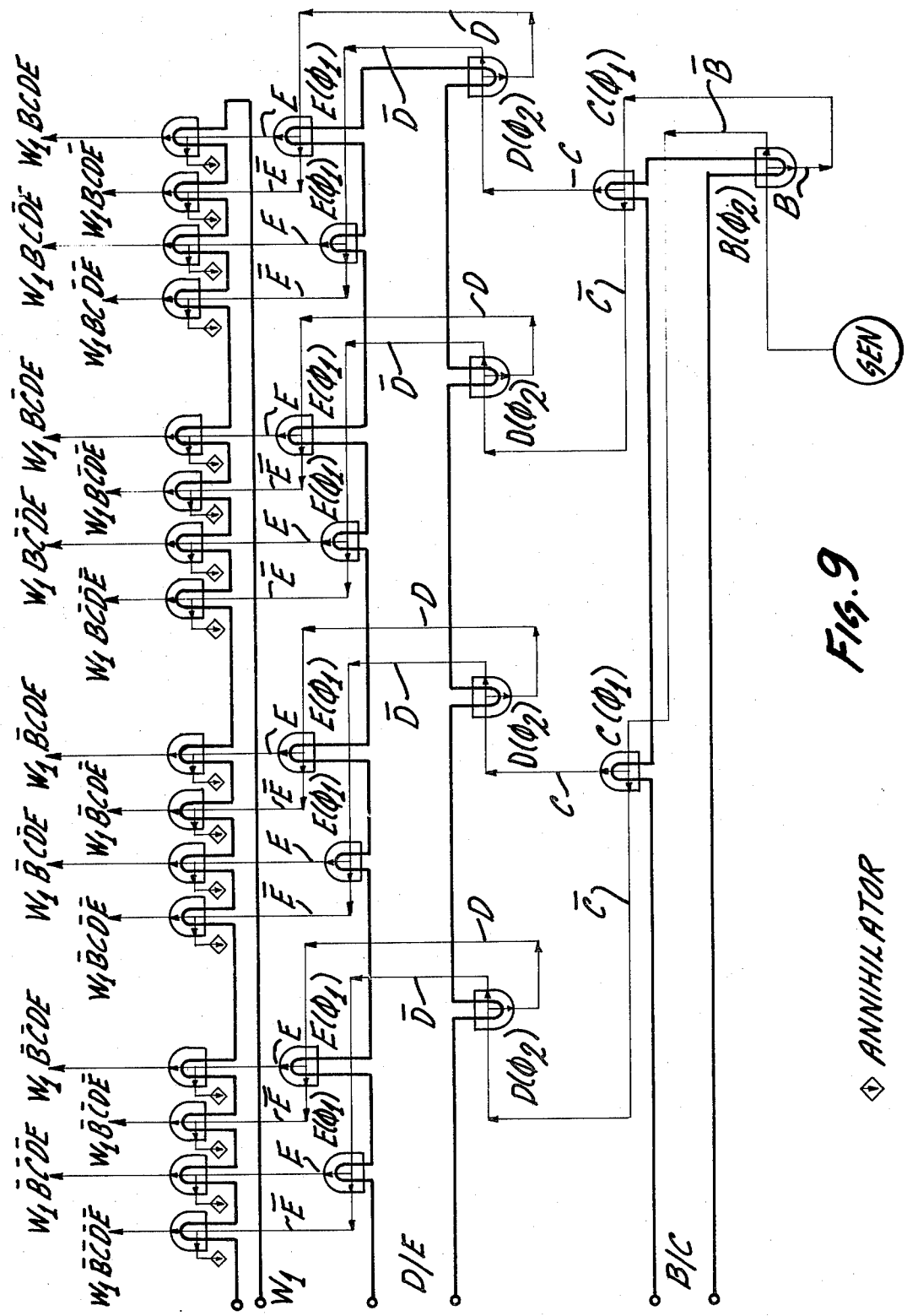
FIG. 9 illustrates another embodiment of the decoder with the write gates located at the decoder outputs to reduce write cycle time in memory operation.

Finally, FIG. 9 illustrates the decoder gate constructed in accordance with this invention utilizing one generator which is connected directly to gate B both of whose outputs B and B̄ are connected to two C gates. The two C gates and the B gate are operated by one conductor B/C. Both gates C are operative during phase 1, while gate B is operative during phase 2, and both outputs from gates C are connected to phase 2 oriented gates D. Both outputs of gate D are connected to gates E which are operable during phase 1 and all gates D and E are connected by a single conductor D/E. Finally, both outputs of gates E are in turn connected to a plurality of write gates W1, all of which are connected by conductor W. In this embodiment, bubbles generated at G are continuously circulating in the system from gate B through gates E but the final decision to enter bubbles into the arrays is made at the output of the decoder by the plurality of write gates W1. This shortens the time between the decision to write into the arrays and the time of data transfer into minor (storage) loops.

What is claimed is:

1. A phase controlled decoder on a magnetic bubble domain propagation structure which includes means capable of supporting magnetic domains thereon and which has propagate elements on which bubbles propagate element-to-element in response to a rotating in-plane magnetic field, said propagate elements defining bubble flow paths,
   a plurality of said propagate elements being transfer elements, oriented on said structure differently from each other and relative to different field directions of said rotating in-plane magnetic field,
   each said transfer elements being located in one flow path which forms an input flow path to receive bubbles therefrom and connected to two flow paths thus forming a gate by which bubbles from said input flow path will be directed to one of the two flow paths forming output flow paths from said gate,
   at least one of said output flow paths from one gate being connected to the input flow path of a gate located subsequent to the flow of bubbles through said one gate, and
   a single electrical conductor means coupled to a plurality of said transfer elements to activate said gate to direct said bubble onto one of said output flow paths in response to the application of a current pulse on said electrical conductor means.

2. The phase controlled decoder as claimed in claim 1, wherein said current pulse is applied at selected field directions of said roating in-plane magnetic field which activates certain of said gates and not others depending on the orientation of said transfer elements.

3. The phase controlled decoder as claimed in claim 2, wherein said electrical conductor means forms current loops at each gate, said current loops being oriented to correspond to the orientation of said transfer elements of said gates.

4. The phase controlled decoder as claimed in claim 3, wherein said current loops are oriented 180° relative to one another so as to made said transfer elements responsive to pulses in a first field direction not responsive to pulses in a field direction oriented 180° to the first field direction.

5. The phase controlled decoder as claimed in claim 4, wherein one flow path to said one gate is connected to a generator for generating magnetic bubbles which are propagated to the input of said one gate and wherein one output flow path from said one gate is connected to a means for annihilating said bubbles.

6. The phase controlled decoder as claimed in claim 4, wherein said one gate forms a write gate with one output flow path from said write gate connected to a means for annihilating said bubbles and wherein the other of said output flow paths is connected to the input of said subsequent gate;

the transfer element of said subsequent gate being oriented in the same direction as said write gate, a third and fourth gate connected to said subsequent gate and oriented in a direction opposite to the orientations of said write gate and said subsequent gate and wherein the output flow paths of said subsequent gate is connected to the input flow paths of said third and fourth gates, and a second conductor means connecting said subsequent gate and third and fourth gates for activating said subsequent gate and said third and fourth gates independently of said write gate.

7. The phase controlled decoder as claimed in claim 6, wherein a plurality of gates are connected to the third and fourth gates and activated by a third conductor in response to pulses applied thereto for directing bubbles received from said third and fourth gates to a storage loop arrangement.

8. The phase controlled decoder as claimed in claim 7, wherein the input of one gate is connected to a generator for generating bubbles which are propagated onto one flow path to the input of said one gate and wherein the output flow paths of said one gate are connected to subsequent gates, and wherein the outputs of said subsequent gates are connected to a plurality of oppositely oriented gates which are connected to each other by a second conductor for activating said oppositely oriented gates;

and wherein a plurality of write gates are located in the output flow paths from said oppositely oriented gates.

9. The phase controlled decoder as claimed in claim 8, wherein a third conductor is coupled to said write gates to activate said write gates independently of the activation of said one and subsequent gates.

10. A phase controlled decoder on a magnetic bubble domain propagation structure which includes means capable of supporting magnetic domains thereon and which has propagate elements on which bubbles propagate element-to-element in response to a rotating in-plane magnetic field, said propagate elements defining bubble flow paths, a plurality of gates formed by selected propagate elements oriented on said structure differently from each other and relative to different field directions of said rotating in-plane magnetic field, each of said gates being located in one flow path which forms an input flow path to receive bubbles therefrom and connected to two flow paths by which bubbles from said input flow path will be directed to one of the two flow paths, at least one of said output flow paths from one gate being connected to the input flow path of a gate located subsequent to the flow of bubbles through said one gate, and a single electrical conductor means coupled by hairpin loops to said gates to activate said gates to direct said bubbles onto one of said output flow paths in response to the application of a current pulse on said electrical conductor means, the duration of said pulse being less than one cycle of said rotating in-plane magnetic field and occurring at a time when said magnetic field direction corresponds to the orientation of the gate or gates selected to be activated.

* * * * *